(12) United States Patent
Lim et al.

(10) Patent No.: US 11,340,298 B2
(45) Date of Patent: May 24, 2022

(54) APPARATUS AND METHOD FOR CALCULATING STATE OF CHARGE OF BATTERY BY REFLECTING NOISE

(71) Applicant: LG CHEM, LTD., Seoul (KR)

(72) Inventors: Bo Mi Lim, Daejeon (KR); Won Tae Joe, Seongnam-Si (KR)

(73) Assignee: LG CHEM, LTD., Seoul (KR)

( * ) Notice: Subject to any disclaimer, the term of this patent is extended or adjusted under 35 U.S.C. 154(b) by 97 days.

(21) Appl. No.: 16/482,949

(22) PCT Filed: Feb. 23, 2018

(86) PCT No.: PCT/KR2018/002267
§ 371 (c)(1),
(2) Date: Aug. 1, 2019

(87) PCT Pub. No.: WO2018/190508
PCT Pub. Date: Oct. 18, 2018

(65) Prior Publication Data
US 2019/0346511 A1    Nov. 14, 2019

(30) Foreign Application Priority Data

Apr. 12, 2017    (KR) .................. 10-2017-0047385

(51) Int. Cl.
*G01R 31/36*    (2020.01)
*G01R 31/392*    (2019.01)
*G01R 31/3842*    (2019.01)

(52) U.S. Cl.
CPC ..... *G01R 31/3648* (2013.01); *G01R 31/3842* (2019.01); *G01R 31/392* (2019.01)

(58) Field of Classification Search
CPC .............. G01R 31/3648; G01R 31/392; G01R 31/3842; G01R 31/374; G01R 31/382; G01R 31/389
See application file for complete search history.

(56) References Cited

U.S. PATENT DOCUMENTS 9,153,988 B2    10/2015    Iwane et al.
2007/0299620 A1    12/2007    Yun et al.
(Continued)

FOREIGN PATENT DOCUMENTS

CN    104242393 A    *    12/2014
CN    106291375 A         1/2017
(Continued)

OTHER PUBLICATIONS

European Seach Report for EP 18785067.2 dated Jan. 2, 2020.
International Search Report for PCT/KR2018/002267 dated May 3, 2018.

*Primary Examiner* — Tarun Sinha
*Assistant Examiner* — Lal C Mang
(74) *Attorney, Agent, or Firm* — Birch, Stewart, Kolasch & Birch, LLP

(57) ABSTRACT

A method of calculating the SOC of a battery in real time includes a battery parameter measurement operation for measuring current, voltage, temperature, and degradation degree of battery, and a real-time SOC calculation operation for calculating the SOC of the battery in real time based on the measured battery parameter. The real-time SOC calculation operation calculates the SOC of the battery in real time using an Extended Kalman Filter.

7 Claims, 9 Drawing Sheets

(56) References Cited

U.S. PATENT DOCUMENTS

2011/0161025 A1 6/2011 Tomura et al.
2014/0074416 A1 3/2014 Park et al.
2014/0303915 A1 10/2014 Jo et al.

FOREIGN PATENT DOCUMENTS

| JP | 2010-60384 A | 3/2010 | | |
|---|---|---|---|---|
| JP | 2010-135075 A | 6/2010 | | |
| JP | WO2015/133103 A1 | 9/2015 | | |
| KR | 10-2008-0000160 A | 1/2008 | | |
| KR | 10-0804698 B1 | 2/2008 | | |
| KR | 10-2013-0105123 A | 9/2013 | | |
| KR | 10-2014-0053592 A | 5/2014 | | |
| KR | 10-1399345 B1 | 5/2014 | | |
| KR | 10-2015-0043216 A | 4/2015 | | |
| KR | 10-1529515 B1 | 6/2015 | | |
| KR | 10-1630411 B1 | 6/2016 | | |
| WO | WO 2015/056964 A1 | 4/2015 | | |
| WO | WO-2015056964 A1 * | 4/2015 | ........... | G01R 31/367 |
| WO | WO 2016/059869 A1 | 4/2016 | | |

\* cited by examiner

Voltage Model WEIGHT ↑ : CHANGE WITHIN SOC ERROR MAXIMUM 2.1%
Ah counting WEIGHT ↑ : CHANGE WITHIN SOC ERROR MAXIMUM 1%

*SETTING VALUE OF TEMPERATURE = (−10, 0, 15, 25, 35, 45)

(a) SOH ERROR 5%

(b) SOH ERROR 10%

Equation 1 - Extended Kalman Filter

| Time Update "prediction" | Measurement Update "correction" |
|---|---|
| (1) Project the state ahead<br>$\hat{x}_k^- = f(\hat{x}_{k-1}, u_{k-1}, 0)$<br>(2) Project the error covariance ahead<br>$P_k^- = A_k P_{k-1} A_k^T + W_k Q_{k-1} W_k^T$ | (1) Compute the Kalman gain<br>$K_k = P_k^- H_k^T (H_k P_k^- V_k^T)^{-1}$<br>(2) Update estimate with measurement<br>$\hat{x}_k = \hat{x}_k^- + K_k(z_k - h(\hat{x}_k^-, 0))$<br>(3) Update the error covariance<br>$P_k = (I - K_k H_k) P_k^-$ |

FIG. 9

(Equation 2)

$$\begin{bmatrix} SOC_{k+1} \\ V_{1,k+1} \end{bmatrix} = \begin{bmatrix} 1 & 0 \\ 0 & \exp(-\frac{\Delta t}{R_1 C_1}) \end{bmatrix} \begin{bmatrix} SOC_k \\ V_{1,k} \end{bmatrix} + \begin{bmatrix} \frac{\Delta t}{Capacity} \\ R_1(1-\exp(-\frac{\Delta t}{R_1 C_1})) \end{bmatrix} I_k$$

FIG. 10

APPARATUS AND METHOD FOR CALCULATING STATE OF CHARGE OF BATTERY BY REFLECTING NOISE

TECHNICAL FIELD

The present invention relates to a device and method for calculating a State Of Charge (SOC) of a battery by reflecting noise.

BACKGROUND ART

More particularly, the present invention relates to a device and method for calculating an SOC of a battery in consideration of noise generated in measuring a value used for battery SOC calculation.

Recently, a high output secondary battery using a non-aqueous electrolytic solution with a high energy density has been developed, and a plurality of high-output secondary batteries are connected in series to constitute a large-capacity secondary battery so that it may be used for driving a motor, such as an electric vehicle, which requires a large electric power.

Thus, one large-capacity secondary battery (hereinafter, referred to as a battery module for convenience of explanation throughout the specification) is usually composed of a plurality of secondary batteries connected in series (hereinafter referred to as a unit battery for convenience of explanation throughout the specification).

In the case of the battery module, particularly, the HEV secondary battery module, as several to dozens of unit cells alternate between charge and discharge, there is a need to control such charge/discharge and the like so as to maintain the battery module in an appropriate operating state.

For this, the HEV battery module detects the SOC of a battery through calculation by detecting voltage, current, temperature, etc. of the battery, and perform the SOC control so that the fuel consumption efficiency of the vehicle becomes the best. In addition, in order to operate the power assist by motor driving at the time of acceleration and the energy recovery (regenerative braking) at the deceleration with good balance, the SOC level at this time is generally set so that, for example, the SOC is in the range of 50% to 70%. When the SOC decreases and becomes, for example, 50%, over charge control is performed, and on the other hand, when the SOC rises and becomes, for example, 70%, over discharge control is performed, so that the SOC is close to the control center.

On the other hand, in the case of an energy storage system, the SOC may be controlled to charge and discharge over the entire range of the energy storage system from 0% to 100%.

In order to accurately perform the SOC control, it is necessary to accurately estimate the SOC of the secondary battery that is performing charge/discharge.

Conventionally, in estimating such an SOC, an SOC has been calculated based on an external error value arbitrarily set at the beginning.

As described above, since the external error value arbitrarily set at the beginning is not suitable for noise of various environments, there is a problem that an error occurs in SOC calculation.

DISCLOSURE OF THE INVENTION

Technical Problem

The present invention provides a device and method for accurately calculating an SOC of a battery by setting an external error value suitable for noise of various environments.

Technical Solution

In accordance with an exemplary embodiment, a method of calculating a State Of Charge (SOC) of a battery in real time includes: measuring a current, a voltage, a temperature, a degradation degree of the battery in a battery parameter measurement operation; and calculating an SOC of the battery in real time based on the measured current, voltage, temperature, degradation degree of the battery in a real-time SOC calculation operation; wherein the real-time SOC calculation operation comprises a real-time SOC arithmetic operation for calculating the SOC of the battery in real time using an Extended Kalman Filter as illustrated in FIG. 9.

(P: error covariance, H: transform coefficient, K: Kalman gain, Q: standard deviation of true value, W: system noise, x: state variable(SOC), z: observation value, V: error with respect to observation true value, k: degree of operation, u: additional input value, f(x,u,o): equation for calculating an SOC, I: unit)matrix A: relationship matrix between current state ($P_k$) and previous state ($P_{k-1}$), h: same as H).

The real-time SOC calculation operation may further include setting a noise variable W set by an external error in the Extended Kalman Filter in a noise variable setting operation.

The noise variable setting operation may include: setting an error occurring when each battery parameter is measured in an external error setting operation; setting a temporary noise variable to be used as a noise variable of the Extended Kalman Filter in a temporary noise variable setting operation; and calculating an error between an SOC calculated by reflecting the external error and the temporary noise variable and an SOC calculated without reflecting the external error in an error calculation operation.

The noise variable setting operation repeatedly may perform the error calculation operation by changing the external error and the temporary noise to various values.

The noise variable setting operation may further include detecting a final noise variable optimized for the external error in a final noise variable detection operation, wherein the final noise variable detection operation may set a temporary noise variable in which an error calculated in the error calculation operation falls within a predetermined range as a final noise variable.

In accordance with another exemplary embodiment, a real time battery state of charge (SOC) calculation device includes: a parameter measurement unit configured to measure a current, a voltage, a temperature, and a degradation degree of a battery; and a real-time SOC calculation unit configured to receive the current, voltage, temperature, and degradation degree of the battery measured in the parameter measurement unit to calculate a SOC of the battery in real time, wherein the real-time SOC calculation unit comprises an operation unit for calculating the SOC of the battery in real time using the Extended Kalman Filter illustrated in FIG. 9.

(P: error covariance, H: transform coefficient, K: Kalman gain, Q: standard deviation of true value, W: system noise, X: state variable(SOC), z: observation value, V: error with respect to observation true value, k: degree of operation, u: additional input value, f(x,u,o): equation for calculating an SOC, I: unit matrix, A: relationship matrix between current state ($P_k$) and previous state ($P_{k-1}$), h: same as H).

The real-time SOC calculation unit may further include a noise variable setting unit for setting a noise variable W by an external error in the Kalman expansion filter and inputting the noise variable W to the operation unit.

The noise variable setting unit may include: an external error setting module configured to receive an error occurring when each of the current, voltage, temperature, and degradation degree is measured from a user and set an external error; a temporary noise variable setting module configured to receive a temporary noise variable to be used as a noise variable of the Kalman expansion filter from a user and set a temporary noise variable; and an error calculation module configured to calculate an error between an SOC calculated based on the external error and the temporary noise variable and an SOC without the external error.

The noise variable setting unit may further include a final noise detection module for detecting a final noise variable optimized for the external error, wherein the final noise detection module may detect a temporary noise variable in which the error calculated in the error calculation module falls within a predetermined range as a final noise variable.

Advantageous Effects

The present invention may calculate an accurate SOC of a battery by setting an external error value suitable for noise in various external environments.

BRIEF DESCRIPTION OF THE DRAWINGS

FIG. 9 is an illustration of Equation 1, which is an Extended Kalman Filter.

FIG. 10 is an illustration of Equation 2, which is an equation for calculating an SOC, f (x, u, 0).

MODE FOR CARRYING OUT THE INVENTION

Figure 1:
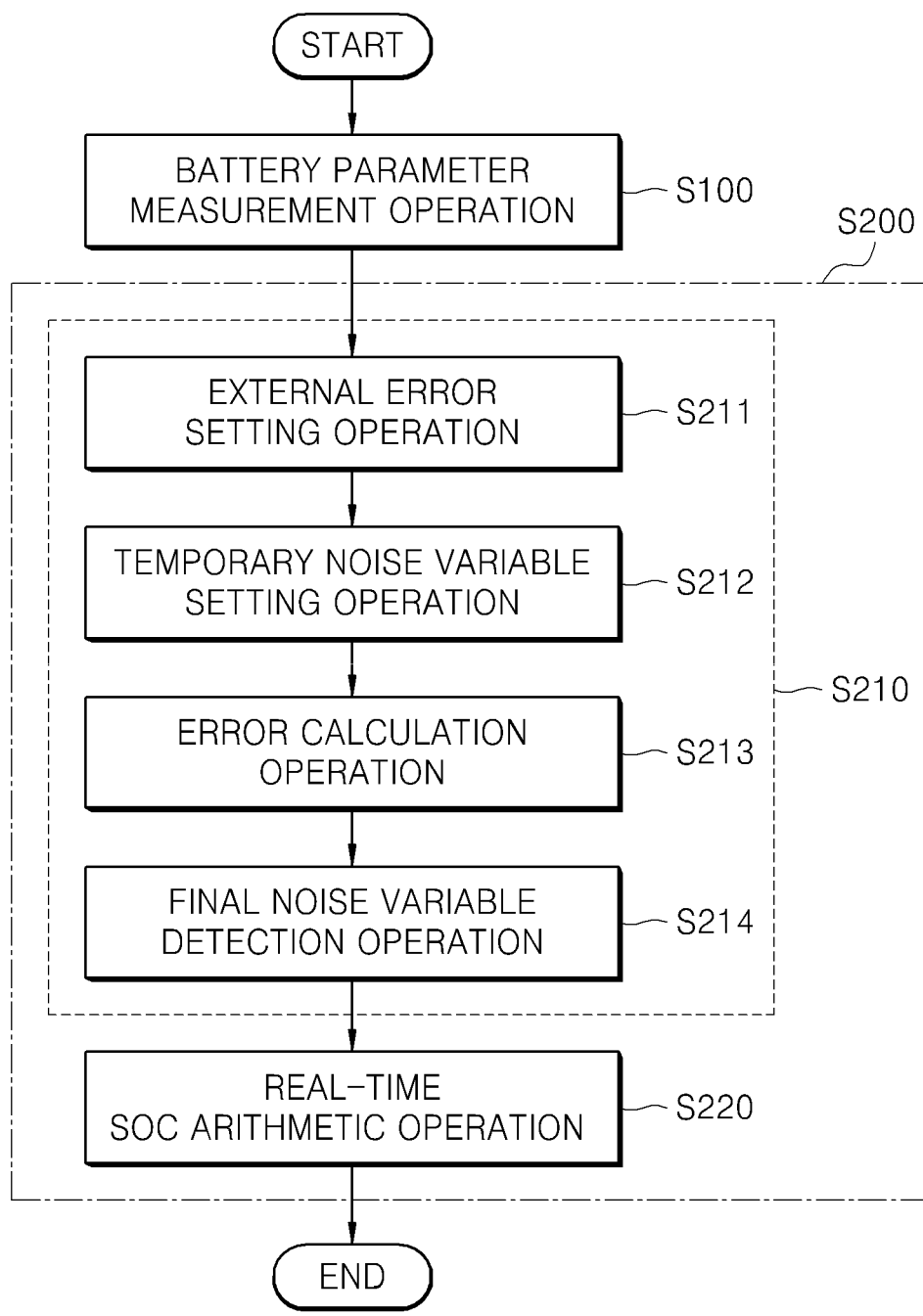
FIG. 1 is a flowchart of a method of calculating a battery SOC in real time according to an embodiment of the present invention.

Hereinafter, embodiments of the present invention will be described in detail with reference to the accompanying drawings so that those skilled in the art can easily carry out the present invention. The present invention may, however, be embodied in different forms and should not be construed as limited to the embodiments set forth herein. Parts not relating to description are omitted in the drawings in order to clearly describe the present invention and like reference numerals refer to like elements throughout.

Although the terms "first," "second," etc., may be used herein to describe various elements, these elements should not be limited by these terms. The above terms are used only to distinguish one component from another. For example, a first component may be referred to as a second component and vice versa without departing from the scope of the present invention. Terms used in this specification are used to describe specific embodiments, and are not intended to limit the scope of the present invention. The singular expressions include plural expressions unless the context clearly dictates otherwise.

Throughout the specification, when a portion is referred to as being "connected" to another portion, it includes not only "directly connected" but also "electrically connected" with another element therebetween. Furthermore, when it is described that one comprises (or includes or has) some elements, it should be understood that it may comprise (or include or has) only those elements, or it may comprise (or include or have) other elements as well as those elements if there is no specific limitation. The term "~ing operation" or "operation of ~ing" used throughout the specification does not mean "operation for ~ing".

Terms used in this specification may be currently widely used general terms in consideration of functions in the present invention but may vary according to the intents of those skilled in the art, precedents, or the advent of new technology. Additionally, in certain cases, there may be terms the applicant selects arbitrarily and in this case, their meanings are described in a corresponding description part of the present invention. Accordingly, terms used in the present invention should be defined based on the meaning of the term and the entire contents of the present invention instead of the simple term name.

In the present invention, the remaining capacity of a battery may mean a charge state of the battery, that is, a State Of Charge (SOC).

1. Method for Calculating SOC of Battery in Real Time According to Embodiment of Present Invention.

FIG. 1 is a flowchart of a method of calculating a battery SOC in real time according to an embodiment of the present invention.

Hereinafter, a method of calculating the battery SOC in real time according to an embodiment of the present invention will be described with reference to FIG. 1.

According to an embodiment of the present invention, a method of calculating the SOC of a battery in real time may include a battery parameter measurement operation S100 for measuring current, voltage, temperature, and degradation degree of battery, and a real-time SOC calculation operation S200 for calculating the SOC of the battery in real time based on the measured battery parameter.

More specifically, the battery parameter measurement operation S100 is an operation for measuring current battery state values, which are measured in a battery management system (BMS) mounted on the battery. Current battery status values, such as battery current, voltage, temperature, degradation, etc., may be measured by a separate device.

Meanwhile, the real-time SOC calculation operation S200 may include a real-time SOC arithmetic operation S220 for calculating the SOC of the battery in real time using an Extended Kalman Filter.

The Extended Kalman Filter may be based on Equation 1 shown in FIG. 9.

More specifically, the Extended Kalman Filter may be roughly divided into a prediction operation and a correction operation.

The prediction operation is an operation for calculating a predicted state when a user input is received according to a state estimated at a previous time, and the correction operation is an operation for calculating an accurate state based on the predicted state and the actual measurement state.

That is, the Extended Kalman Filter may be a method of reducing the error by repeatedly performing prediction→correction→prediction→correction.

On the other hand, in the Kalman filter, an equation for calculating an SOC, f (x, u, 0), may be calculated based on Equation 2 shown in FIG. 10.

Meanwhile, the real-time SOC calculation operation S200 may further include a noise variable setting operation S210 for setting a noise variable W set by a noise value of an external process.

More specifically, the noise variable setting operation S210 may include an external error setting operation S211 for setting an external error inevitably occurring when measuring each battery parameter, a temporary noise variable setting operation S212 for setting a temporary noise variable to be used as a noise variable W of the Extended Kalman Filter, and an error calculation operation S213 for calculating an error between the SOC calculated based on the external error and the temporary noise variable and the SOC having no external error.

Meanwhile, the noise variable setting operation S210 may repeatedly perform the error calculation operation S213 by changing the external error and the temporary noise variable to various values.

Meanwhile, the error calculation operation S213 may express the error value as a time-error graph.

Figure 2:
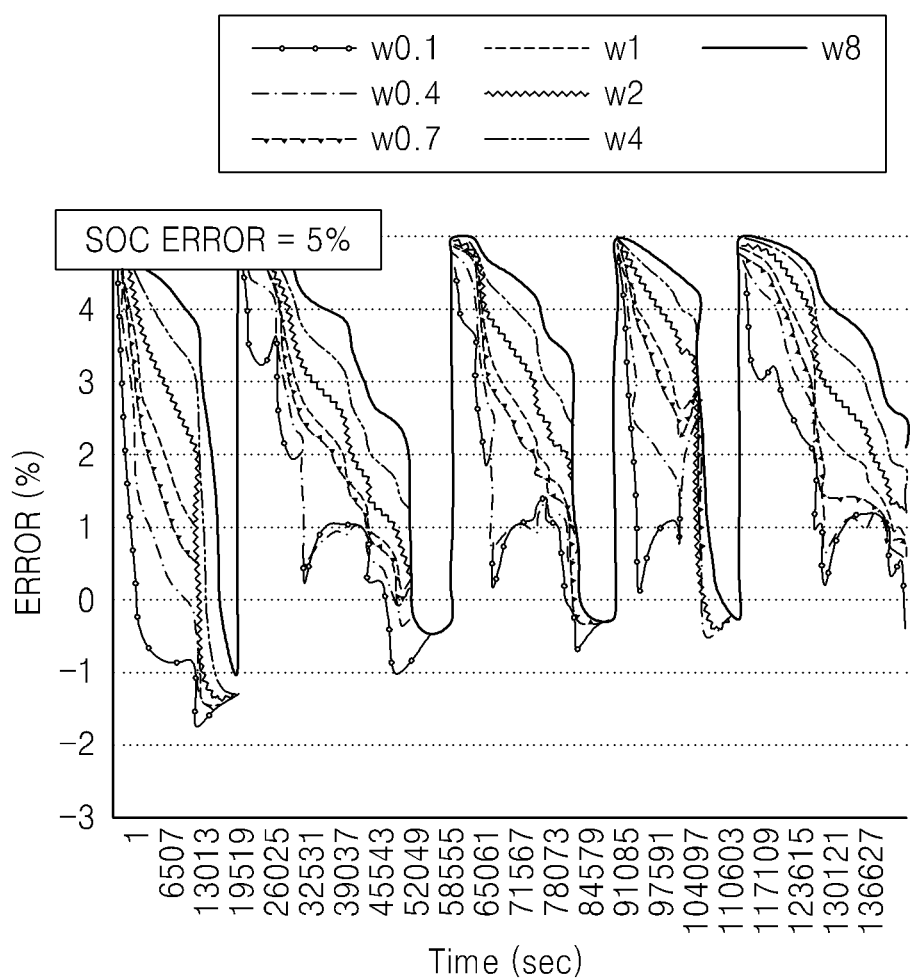
FIG. 2 is an example of a time-error graph showing an error of a noise variable of a voltage model in an error calculation operation.

FIG. 2 is an example of a time-error graph showing an error of a noise variable of a voltage model in an error calculation operation.

Referring to FIG. 2, it may be confirmed that as the noise variable of the voltage model is greater, it takes a longer time for the SOC of the battery to converge to the actual value.

Therefore, in this case, the smallest value of the noise variable of the voltage model may be advantageous.

Meanwhile, the noise variable setting operation S210 may further include a final noise variable detection operation S214 for detecting a final noise variable optimized for the external error.

More specifically, the final noise variable may be a temporary noise variable whose error calculated in the error calculation operation S213 falls within a predetermined range.

Hereinafter, an optimized noise variable setting according to an embodiment of the present invention will be described based on concrete experimental data.

FIGS. 3 to 6 are error graphs for the noise variables of each model of voltage, temperature, current, and degradation.

Figure 3:
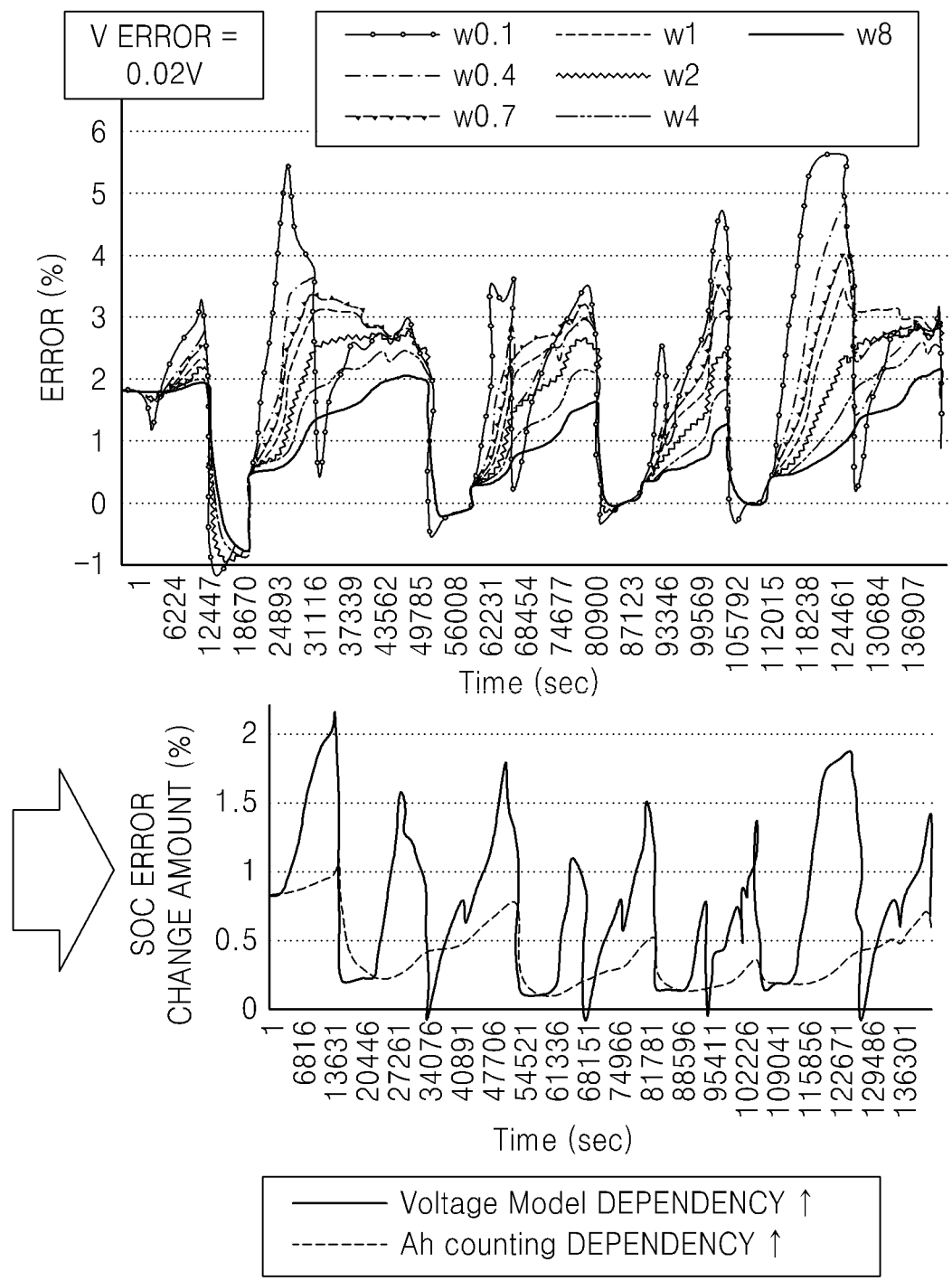
FIG. 3 is an error graph for the noise variable of a voltage model.

First, FIG. 3 is an error graph for the noise variable of a voltage model when there is a voltage error.

Referring to the upper graph of FIG. 3, when the external error is 0.02V, it may be confirmed that as the noise variable of the voltage model is greater, error occurs less.

Meanwhile, referring to the lower graph of FIG. 3, in relation to the error change rate of an SOC, in a case where there is an external voltage error, if the noise variable of the voltage model increases, the error may differ by up to 2%.

Meanwhile, the error according to the noise variable of the current model is maximum 1%. If there is an error in the external voltage, in relation to the final noise variable, it may be the right method to set the weight for the noise variable of the voltage model to be as low as possible and to set the weight for the noise variable of the current model to be high.

Figure 4:
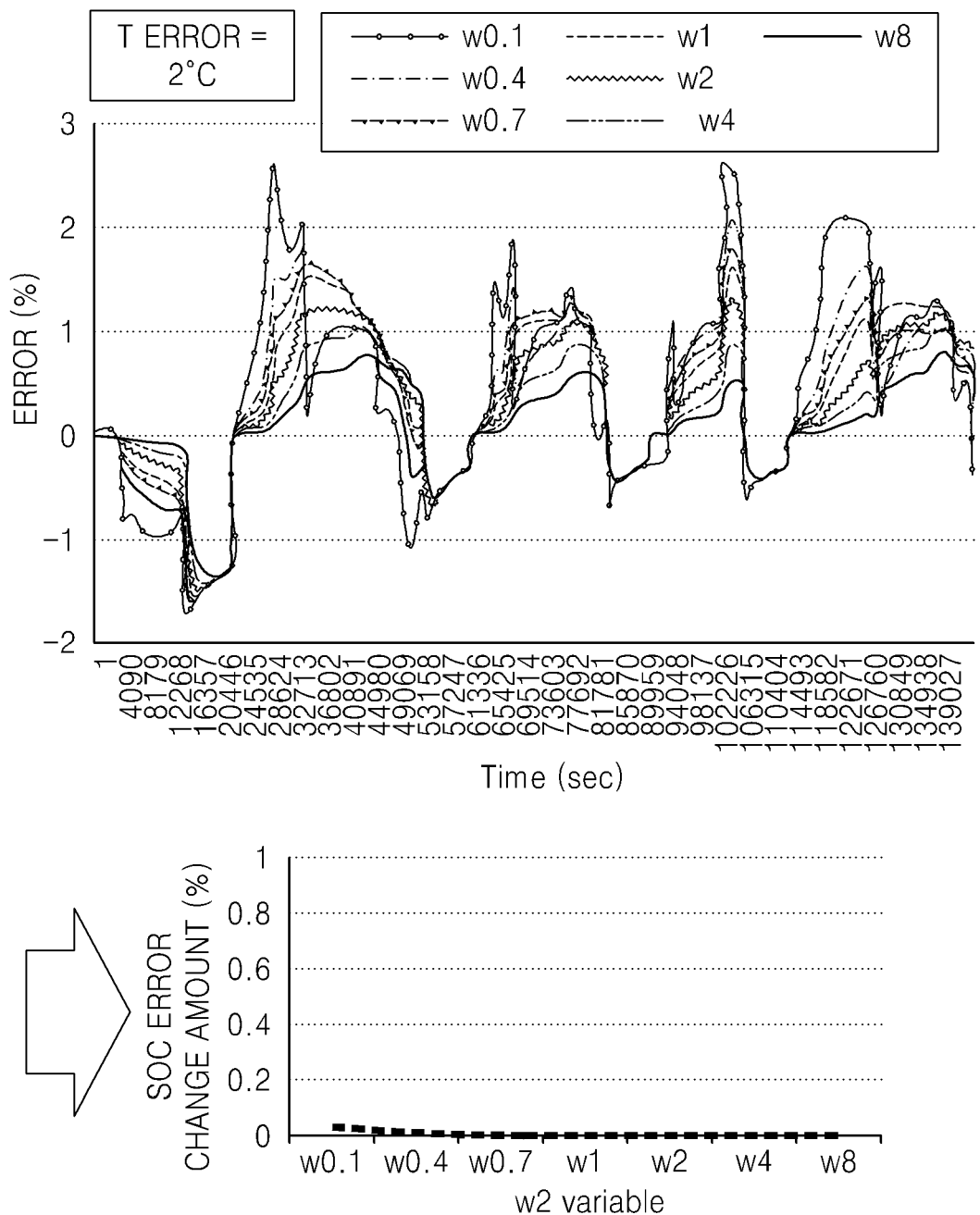
FIG. 4 is an error graph for the noise variable of a temperature model.

On the other hand, FIG. 4 is an error graph for the noise variable of a voltage model when there is a temperature error.

Referring to the upper graph of FIG. 4, it is shown that as the noise variable of the temperature model is greater, error is less. However, when considering the actual cell charge/discharge, the error change rate of the SOC is close to zero, so that the noise variable of the temperature model is not large.

Figure 5:
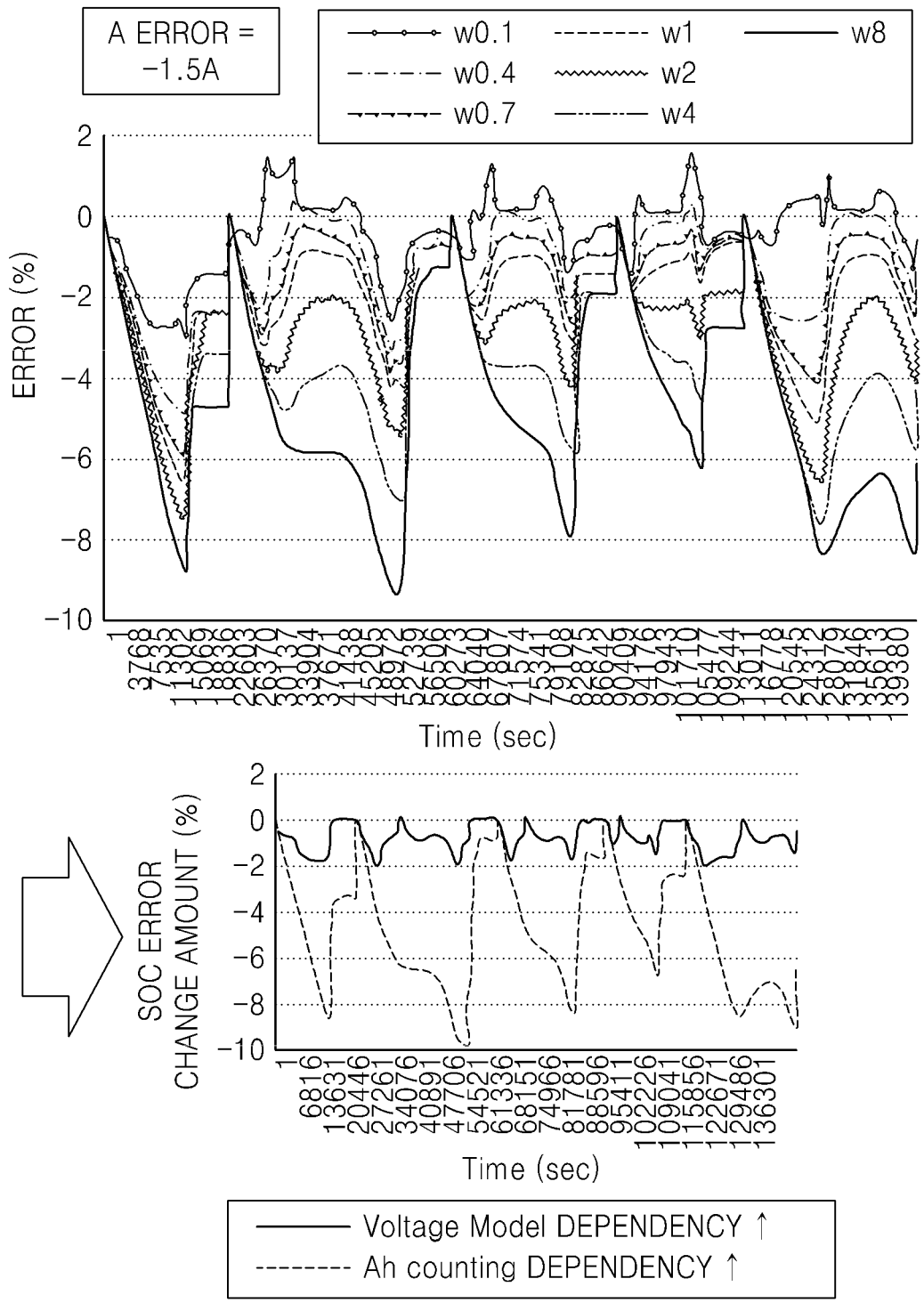
FIG. 5 is an error graph for the noise variable of a current model.

Meanwhile, FIG. 5 is an error graph for the noise variable of a voltage model when there is a current error.

Referring to the upper graph of FIG. 5, it may be confirmed that as the noise variable of the voltage model is smaller, the SOC error appears less.

Meanwhile, referring to the lower graph of FIG. 5, when the noise variable of the voltage model is minimized, it may be confirmed that the SOC error change rate for the noise variable of the current model is 9% or more, compared with the maximum SOC error change rate of 2%.

Therefore, if external current noise is present, the noise variable of the voltage model may be set to a small value, the weight corresponding to the voltage model may be set to be large, and the weight corresponding to the current model may be set to be low.

Figure 6:
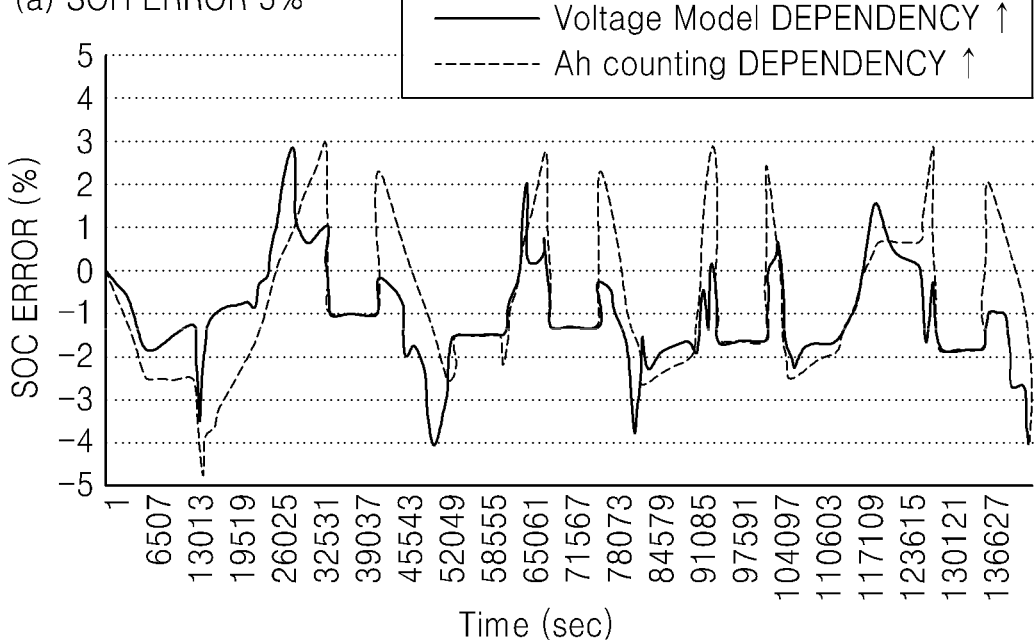
FIG. 6 is an error graph for a degradation degree and a noise variable.
Figure 6:
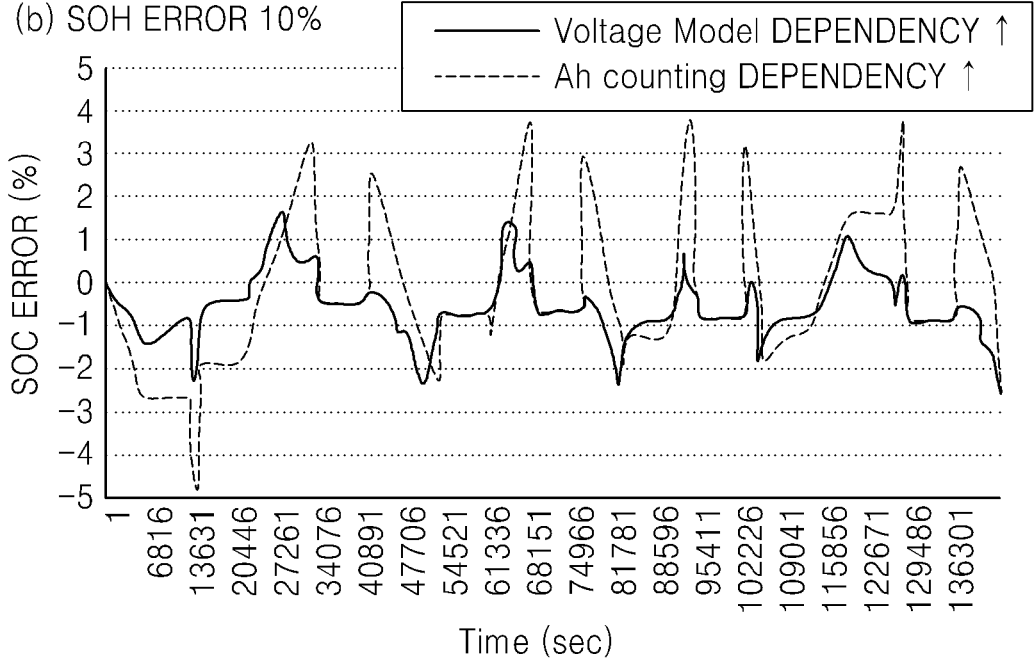

Moreover, FIG. 6 is a graph illustrating an error occurring according to a degradation degree and a weight corresponding to a current model and a voltage model.

First, the upper graph of FIG. 6 is an error graph showing an error occurring according to a weight corresponding to the current model and the voltage model when the degradation degree is 5%.

In this case, it may be confirmed that the graph has a similar value regardless of the weight of the current model and the weight of the voltage model.

However, as shown in the lower graph of FIG. 6, when the degradation degree is 10% and the weight corresponding to the voltage model is large, it may be confirmed that the error is less than when the weight corresponding to the current model is large.

Therefore, the weight corresponding to the voltage model may be set to be higher as the degradation degree progresses.

Figure 7:
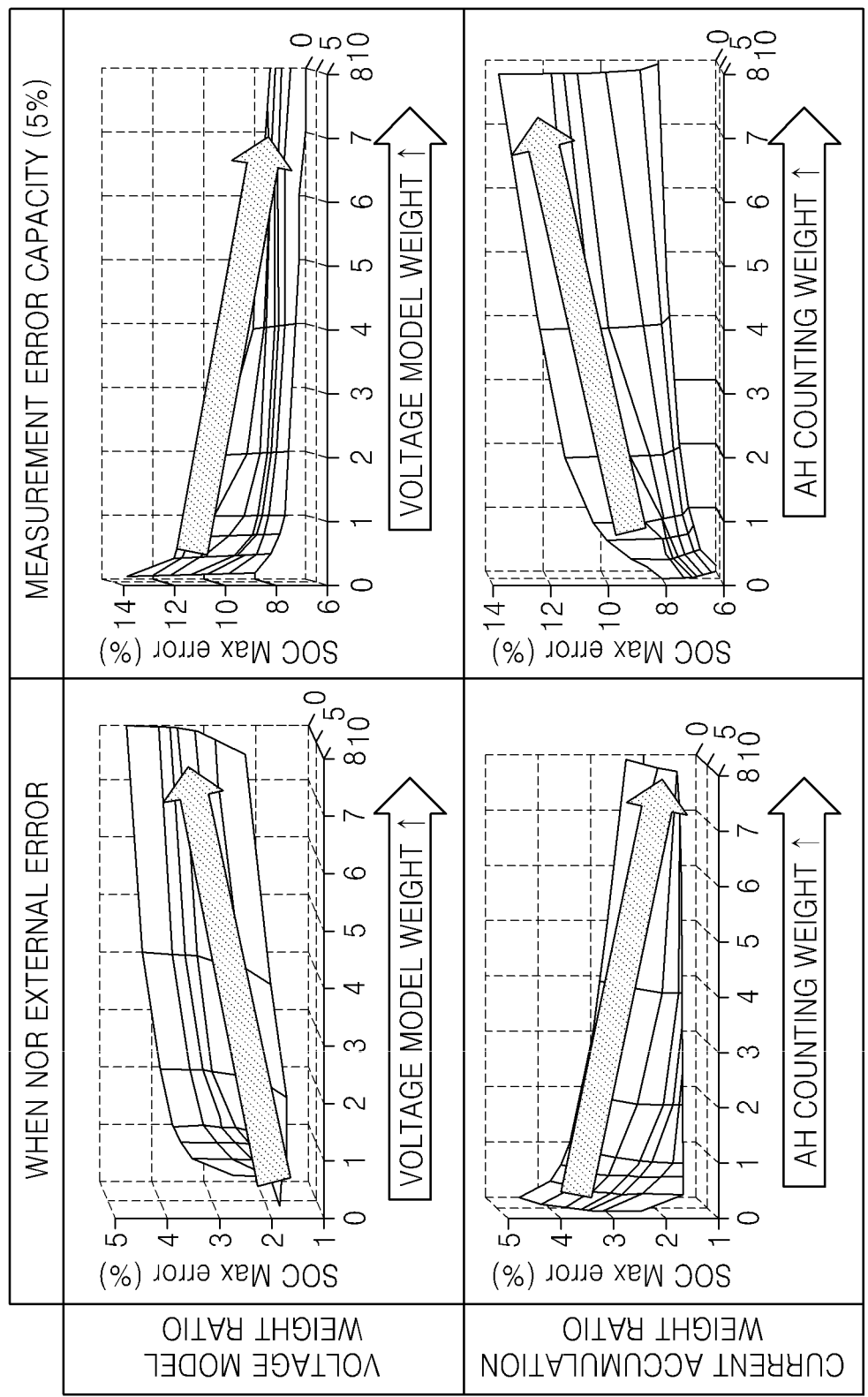
FIG. 7 is a graph showing an error of a voltage model and a current model according to the presence or absence of the external error.

FIG. 7 is a graph showing an error of a voltage model and a current model according to the presence or absence of the external error.

Taken together, errors in the process of measuring parameters such as the voltage, current, temperature and degradation degree of the battery may not be avoided. To correct this to a more accurate value, the noise variable of the voltage model may be set to be as small as possible and the weight corresponding to the voltage model may be set to be large.

Figure 8:
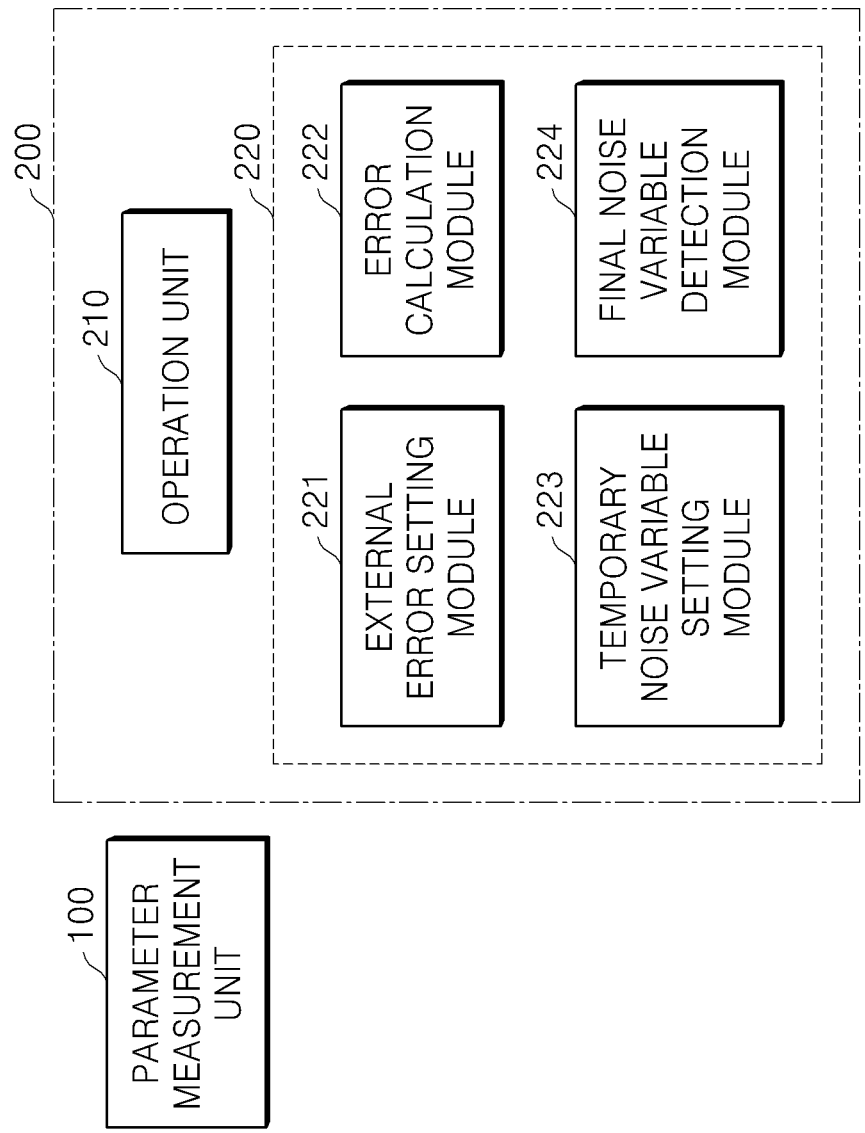
FIG. 8 is a general configuration diagram of a real-time battery SOC calculation device according to an embodiment of the present invention.

2. Real-Time Battery SOC Calculation Device According to Embodiment of Present Invention FIG. 8 is a general configuration diagram of a real-time battery SOC calculation device according to an embodiment of the present invention.

Hereinafter, a real-time battery SOC calculation device according to an embodiment of the present invention will be described with reference to FIG. 8.

A real-time battery SOC calculation device according to an embodiment of the present invention includes a parameter measurement unit 100 for measuring the current, voltage, temperature and degradation degree of the battery, and a real time SOC calculation unit 200 for calculating the SOC of the battery in real time based on the measured current, voltage, temperature and degradation degree of the battery measured in the parameter measurement unit 100.

More specifically, although the parameter measurement unit 100 has been described as a separate configuration in the present invention, it may be measured in a battery management system that is basically installed in the battery.

Meanwhile, the real-time SOC calculation unit 200 may include an operation unit 210 for calculating the SOC of the battery in real time using the Extended Kalman Filter.

Meanwhile, the Extended Kalman Filter is the same as the Extended Kalman Filter used in the method of calculating the SOC of the battery in real time according to an embodiment of the present invention, and a detailed description thereof will be omitted.

Meanwhile, the real-time SOC calculation unit 200 may further include a noise variable setting unit 220 for setting a noise variable according to an external error to input the noise variable to the operation unit.

More specifically, the noise variable setting unit 220 includes an external error setting module 221 for receiving an error occurring when measuring each battery parameter from a user and setting an external error, a temporary noise variable setting module 222 for receiving a temporary noise variable to be used as a noise variable of the Kalman expansion filter from a user and setting a temporary noise variable, and an error calculation module 223 for calculating the SOC calculated based on the external error and the temporary noise variable and the SOC having no external error.

Meanwhile, the external error setting module 221 may perform an external error setting operation of the battery SOC calculating method in real time according to the embodiment of the present invention. The temporary noise variable setting module 222 may perform a temporary noise variable setting operation of the battery SOC calculation method in real time according to the embodiment of the present invention. The error calculation module 223 may perform an error calculation operation of the battery SOC calculation method in real time according to the embodiment of the present invention.

Meanwhile, the noise variable setting unit 220 may further include a final noise variable detection module 224 for detecting a final noise variable optimized for the external error.

More specifically, the final noise variable detection module 224 may detect a temporary noise variable, in which the error calculated in the error calculation module 223 falls within a predetermined range, as a final noise variable.

Meanwhile, the operation unit 210 may calculate a real-time SOC by substituting the value set in the noise variable setting unit 220 into the Kalman filter of Equation 1.

On the other hand, although the technical idea of the present invention is specifically described with reference to the above embodiments, it should be noted that the above embodiments are for the purpose of explanation and not for the purpose of limitation. It will be apparent to those skilled in the art that various modifications and variations can be made in the present invention without departing from the spirit and scope of the invention.

The invention claimed is:

1. A method of calculating a state of charge (SOC) of a battery in real time, the method comprising:
   measuring a current, a voltage, a temperature, and a degradation degree of the battery in a battery parameter measurement operation; and
   calculating a SOC of the battery in real time based on the measured current, voltage, temperature, and degradation degree of the battery in a real-time SOC calculation operation;
   wherein the real-time SOC calculation operation comprises a real-time SOC arithmetic operation for calculating the SOC of the battery in real time the following Extended Kalman Filter:
   a time update step including:
   a step of projecting the state ahead using the following equation:

$\widehat{x_k^-} = f(\widehat{x_{k-1}}, u_{k-1}, 0)$; and a step of projecting the error covariance ahead using the following equation:

$P_k^- = A_k P_{k-1} A_k^T + W_k Q_{k-1} W_k^T$; and a measurement update step including:
   a step of computing the Kalman gain using the following equation:

$K_k = P_k^- H_k^T (h_k P_k^- V_k^T)^{-1}$;

a step of updating the estimate with the measurement using the following equation:

$\widehat{x_k} = \widehat{W_k^-} + K_k(z_k - h(\widehat{x_k^-}, 0))$; and a step of updating the error covariance using the following equation:

$P_k = (I - K_k H_k) P_k^-$, wherein P: error covariance, H: transform coefficient, K Kalman gain, Q: standard deviation of true value, W: system noise, x: state variable(SOC), z: observation value, V: error with respect to observation true value, k: degree of operation, u: additional input value, f(x,u,o): equation for calculating an SOC, I: unit matrix, A: relationship matrix between current state ($P_k$) and previous state ($P_{k-1}$), h: same as H,
   wherein the real-time SOC calculation operation further comprises setting a noise variable W, which is set by an external error in the Extended Kalman Filter in a noise variable setting operation, and
   wherein the noise variable setting operation includes:
   setting a noise variable and an initial weight for each of a voltage model, a temperature model, a current model and a degradation model,
   detecting a voltage error above a predetermined level and reducing the weight for the noise variable of the voltage model such that the weight for the current model is higher than the weight for the noise variable of voltage model, or
   detecting a current error above a predetermined level and reducing the weight for the noise variable of the current model such that the weight for the voltage model is higher than the weight for the noise variable of current model.

2. The method of claim 1, wherein the noise variable setting operation comprises:
   setting an error occurring when each of the current, voltage, temperature, and degradation degree is measured in an external error setting operation;
   setting a temporary noise variable to be used as a noise variable of the Extended Kalman Filter in a temporary noise variable setting operation; and
   calculating an error between an SOC calculated by reflecting the external error and the temporary noise variable and an SOC calculated without reflecting the external error in an error calculation operation.

3. The method of claim 2, wherein the noise variable setting operation repeatedly performs the error calculation operation by changing the external error and the temporary noise to various values.

4. The method of claim 3, wherein the noise variable setting operation further comprises detecting a final noise variable optimized for the external error in a final noise variable detection operation, wherein the final noise variable detection operation sets a temporary noise variable in which an error calculated in the error calculation operation falls within a predetermined range as a final noise variable.

5. A real time battery state of charge (SOC) calculation device comprising a BMS configured to:

measure a current, a voltage, a temperature, and a degradation degree of a battery, receive the current, voltage, temperature, and degradation degree of the battery measured in the parameter measurement unit to calculate a SOC of the battery in real time, and calculate the SOC of the battery in real time using the following Extended Kalman Filter: a time update step including:

a step of projecting the state ahead using the following equation:

$$\widehat{x_k}^- = f(\widehat{x_{k-1}}, u_{k-1}, 0); \text{ and}$$

a step of projecting the error covariance ahead using the following equation:

$$P_k^- = A_k P_{k-1} A_k^T + W_k Q_{k-1} W_k^T; \text{ and}$$

a measurement update step including:
a step of computing the Kalman gain using the following equation:

$$K_k = P_k^- H_k^T (h_k P_k^- V_k^T)^{-1};$$

a step of updating the estimate with the measurement using the following equation: $\widehat{x_k} = \widehat{w_k}^- + K_K (Z_K - h(\widehat{x_k}^-, 0))$; and a step of updating the error covariance using the following equation: $P_k = (I - K_k H_k) P_k^-$, wherein P: covariance, H: transform coefficient, K Kalman gain, Q: standard deviation of true value, W: system noise, x: state variable(SOC), z: observation value, V: error with respect to observation true value, k: degree of operation, u: additional input value, f(x,u,o): equation for calculating an SOC, I: unit matrix, A: relationship matrix between current state ($P_k$) and previous state ($P_{k-1}$), h: same as H, and wherein the BMS is further configured to:

set a noise variable W by an external error in the Extended Kalman Filter by setting a noise variable and a weight for each of a voltage model, a temperature model, a current model and a degradation model, and detect a voltage error above a predetermined level and reduce the weight for the noise variable of the voltage model such that the weight for the current model is higher than the weight for the noise variable of voltage model, or detect a current error above a predetermined level and reduce the weight for the noise variable of the current model such that the weight for the voltage model is higher than the weight for the noise variable of current model.

6. The device of claim 1, wherein the BMS is further configured to:

receive an error occurring when each of the current, voltage, temperature, and degradation degree is measured from a user and set an external error, receive a temporary noise variable to be used as a noise variable of the Kalman expansion filter from a user and set a temporary noise variable, and calculate an error between an SOC calculated based on the external error and the temporary noise variable and an SOC without the external error.

7. The device of claim 6, wherein the BMS is further configured to:

detect a final noise variable optimized for the external error, and detect a temporary noise variable in which the error calculated in the error calculation module falls within a predetermined range as a final noise variable.

* * * * *